(12) United States Patent
Davidovici

(10) Patent No.: US 7,800,669 B2
(45) Date of Patent: Sep. 21, 2010

(54) SYSTEM AND METHOD FOR IMAGE SENSOR ELEMENT OR ARRAY WITH PHOTOMETRIC AND REALTIME REPORTING CAPABILITIES

(75) Inventor: Sorin Davidovici, Oceanport, NJ (US)

(73) Assignee: R.J.S. Technology, Inc., Hollis, NH (US)

( * ) Notice: Subject to any disclaimer, the term of this patent is extended or adjusted under 35 U.S.C. 154(b) by 1002 days.

(21) Appl. No.: 11/533,851

(22) Filed: Sep. 21, 2006

(65) Prior Publication Data

US 2007/0064146 A1 Mar. 22, 2007

Related U.S. Application Data

(60) Provisional application No. 60/719,306, filed on Sep. 21, 2005, provisional application No. 60/719,304, filed on Sep. 21, 2005, provisional application No. 60/719,305, filed on Sep. 21, 2005, provisional application No. 60/727,897, filed on Oct. 18, 2005.

(51) Int. Cl.
*H04N 3/14* (2006.01)
*H04N 9/64* (2006.01)

(52) U.S. Cl. .................. 348/296; 348/256; 348/297

(58) Field of Classification Search ............ 348/296, 348/297
See application file for complete search history.

(56) References Cited

U.S. PATENT DOCUMENTS

| | | | |
|---|---|---|---|
| 4,352,210 A | 9/1982 | Puckette | |
| 4,419,692 A | 12/1983 | Modisette | |
| 4,629,879 A | 12/1986 | Baldwin | |
| 4,825,144 A | 4/1989 | Alberkrack | |
| 5,416,616 A | 5/1995 | Jenkins et al. | |
| 5,461,426 A | 10/1995 | Limberg | |
| 5,703,641 A | 12/1997 | Watanabe | |
| 5,737,018 A | 4/1998 | Shimizu | |
| 6,188,056 B1 | 2/2001 | Kalnitsky | |
| 6,437,850 B2 | 8/2002 | Vernackt | |
| 6,760,070 B1* | 7/2004 | Merrill et al. | ........... 348/294 |
| 6,794,922 B2 | 9/2004 | Mashimo | |
| 6,809,358 B2 | 10/2004 | Hsieh et al. | |

(Continued)

FOREIGN PATENT DOCUMENTS

| | | |
|---|---|---|
| EP | 0365294 A2 | 4/1990 |
| EP | EP1484740 A2 | 12/2004 |
| WO | WO0038409 A1 | 6/2000 |

OTHER PUBLICATIONS

International Search Report PCT/US06/36793, Apr. 2, 2007, Davidovici.

(Continued)

*Primary Examiner*—Ngoc-yen Vu
(74) *Attorney, Agent, or Firm*—Lindsay G. McGuinness

(57) ABSTRACT

A solid-state pixel structure or pixel array includes integrated exposure control provided within the pixel structure and/or pixel array. Including exposure control within the pixel structure and/or array allows optimal exposure to be achieved in real time. Optimal exposure is achieved by measuring the response of pixel structures to received electromagnetic radiation, and using the response information, in conjunction with knowledge regarding the pixel structure capabilities and photometric thresholds, to determine when the pixel structure is operating optimally. Tight control of the exposure of the pixel structure to the electromagnetic radiation allows the pixel structure to operate optimally in order to provide an optimal captured image.

38 Claims, 12 Drawing Sheets

U.S. PATENT DOCUMENTS

| | | | |
|---|---|---|---|
| 6,821,245 B2 | 11/2004 | Cline | |
| 6,849,841 B2 | 2/2005 | Byren | |
| 6,867,693 B1 | 3/2005 | Radin | |
| 6,972,995 B1* | 12/2005 | Hopper et al. | 365/185.19 |
| 7,489,351 B2* | 2/2009 | Frey | 348/294 |
| 2002/0024605 A1* | 2/2002 | Merrill et al. | 348/296 |
| 2002/0033714 A1 | 3/2002 | Perrott | |
| 2002/0113887 A1* | 8/2002 | Iimura et al. | 348/310 |
| 2002/0176009 A1 | 11/2002 | Johnson | |
| 2002/0176067 A1 | 11/2002 | Charbon | |
| 2003/0098914 A1* | 5/2003 | Easwar | 348/229.1 |
| 2003/0112351 A1* | 6/2003 | Clark | 348/307 |
| 2003/0150977 A1 | 8/2003 | Yamazaki | |
| 2003/0184673 A1 | 10/2003 | Skow | |
| 2005/0046719 A1 | 3/2005 | Inui | |
| 2005/0185064 A1 | 8/2005 | Ogawa | |

OTHER PUBLICATIONS

International Search Report PCT/US06/36785, May 11, 2007, Davidovici.
International Search Report PCT/US06/36794, May 22. 2007, Davidovici.
International Search Report PCT/US06/40340, Aug. 28, 2007, Davidovici.
Vu, T T et al. "A GAAS Phase Digitizing and summing system for microwave signal storage" IEEE Journal of Solid-State Circuits, IEEE Service Center, Piscataway NJ US vol. 24, No. 1, 1 (Feb. 1, 1989) pp. 104-117.
EP06815089 Supplementary Search Report Aug. 27, 2009.
EP06815090.3 Supplemental Search Report Aug 28, 2009.
EP06836131 Supplemental Search Report Aug. 27, 2008.
EP06815082 Supplemental Search Report Sept. 8, 2009.

* cited by examiner

SYSTEM AND METHOD FOR IMAGE SENSOR ELEMENT OR ARRAY WITH PHOTOMETRIC AND REALTIME REPORTING CAPABILITIES

CROSS REFERENCE TO RELATED APPLICATIONS

This application claims priority under 35 U.S.C. §1.119(e) to provisional patent application Nos. 60/719,306, 60/719,304 and 60/719,305 filed on Sep. 21, 2005 by Davidovici et al, and to provisional patent application Ser. No. 60/727,897 filed Oct. 18, 2005 by Davidovici et al. All of the above identified priority applications are incorporated herein by reference.

FIELD OF THE INVENTION

This invention relates generally to the field of electronic imaging and more particularly to a method and apparatus for enhanced image capture using photometric measurement and reporting.

BACKGROUND OF THE INVENTION

Photography is the process of making pictures by means of the action of light. Light is the commonly used term for electromagnetic radiation in a frequency range that is visible to the human eye. Light patterns reflected or emitted from objects are recorded by an image sensor through a timed exposure. Image sensors can be chemical in nature, such as photographic film, or solid state in nature, such as the CCD and CMOS image sensors employed by digital still and video cameras.

Digital cameras have a series of lenses that focus light to create an image of a scene. But instead of focusing this light onto a piece of photographic film, as in traditional cameras, it focuses it onto the solid state image sensor which converts the electromagnetic radiation of the light into an electrical charge. The atomic element of an image sensor is said to be a picture element, or a 'pixel' and practical image sensors for digital photography typically have a large number of pixels. The electrical charge indicates a relative intensity of the electromagnetic radiation as perceived by the image sensor, and generally is used to associate a light intensity value with the pixel.

One goal of photography is to provide an image that accurately represents the image viewed by the human eye. However, the human eye is not equally sensitive to all wavelengths of light. As a result, the response of the image sensors to the electromagnetic radiation that impinges upon them must be adjusted in accordance with the sensitivities of human vision. The adjustment is typically done by the adjusting the exposure of the image sensor to the electromagnetic radiation to compensate for human sensitivities to different wavelengths.

However it is often difficult to determine the correct level of exposure to provide to the image sensor; the failure to determine and apply the correct level of exposure of electromagnetic radiation to the light sensitive image sensor component results in degradation of the captured image. Such degradation is often referred to as 'overexposed' or 'underexposed.' Overexposure occurs when the level of electromagnetic radiation that is exposed to the light sensitive component is greater than the optimal level for the light wavelength. Overexposure often results in lack of highlight detail in the captured image.

FIG. 1A illustrates the response characteristic of an image sensor to overexposure. The abscissa represents the intensity of the electromagnetic radiation impinging upon the sensor. The ordinate represents the corresponding output voltage of the image sensor. For low intensity radiation, the voltage of the image sensitive component increases linearly with the intensity of the electromagnetic radiation. However, as the intensity of the electromagnetic radiation increases beyond a threshold $T_o$ (as indicated by the dashed line of FIG. 1a), the image sensitive component output voltage does not change accordingly, but rather levels out at some maximum voltage. Thus, the image sensitive device cannot accurately represent images having electromagnetic radiation intensity levels that exceed the threshold $T_o$ and the recorded image is said to be overexposed.

FIG. 1B illustrates the response characteristic of an image sensor to underexposure. Underexposure occurs when the level of exposure of the image sensitive component to the electromagnetic radiation is less than the optimal level. Underexposure often results in lack of shadow detail in the captured image. As can be seen in FIG. 1B, for low intensity values the voltage of the image sensitive component does not change in response to changes in the intensity of the electromagnetic radiation. Only after the light intensity is past a minimum light intensity level threshold Tu does the voltage of the image sensitive component increase linearly with the intensity of the electromagnetic radiation. Thus, the image sensitive device cannot accurately represent image details or colors having electromagnetic radiation intensity levels that do not exceed the threshold $T_U$ and the recorded image is said to be underexposed.

FIG. 1C illustrates a transfer function that reflects the correct exposure of an image sensor to electromagnetic radiation. Correct exposure occurs when an image is captured optimally with full detail in the segments of low electromagnetic radiation intensity levels as well as in the segments of high electromagnetic radiation intensity levels. Correct exposure allows both highlights and shadows sections of the original image to be accurately represented in the captured electronic representation of the image.

FIGS. 2A-2C illustrates histograms of pixel intensities of exposed images, wherein the exposed images each have a range of potential pixel intensities from 0 through 255. FIG. 2A is a histogram of pixel intensities that may be found in an image that has been overexposed, for example using an exposure process having a transfer function such as that illustrated in 1A. FIG. 2B is a histogram of pixel intensities that may be found in an underexposed image, such as an image captured using the transfer function of FIG. 1B. FIG. 2C is a histogram of pixel intensities that may be found in an image that has been correctly exposed, for example using the transfer function of FIG. 1C. While the histogram of FIG. 2C illustrates a normalized distribution of pixel intensities, FIG. 2A illustrates that an overexposed image has pixel intensities that are compressed at the maximum image sensor output value ('255'), while an underexposed image has pixel intensities that are compressed at the minimum image sensor output value ('0').

An image reaching the pixel array contains dark and light areas that can differ drastically in intensity and thus cause the image to have high dynamic range. Although the dynamic range of the image might fit within the dynamic range of the pixel array the exposure calculation must be extremely accurate. The limited dynamic range of realistic pixel arrays and the high dynamic range of typical images combine to make accurate exposure calculation a very difficult task.

The current art recognizes a number of methods of calculating the exposure time. One known method is to capture the image using an estimated exposure time setting, observe the pixel output histogram, arrive at a new exposure time estimate and acquire the image using this new exposure time estimate. This method is wasteful of power as it captures each image twice. It is also inaccurate as the second exposure time estimate, although better than the first value, is still an approximation and numerous pixels will be exposed to light intensities that are outside of their dynamic range.

Another method is to examine the entire image, measure the average light image intensity value and calculate an exposure time based on this value. However, such a method is inaccurate as it does not take into account the actual distribution of light intensities within the image. Here too numerous pixels will be exposed to light intensities that are outside of their dynamic range.

Identifying the correct amount of exposure is further complicated by photometry. Photometry is the science of measurement of visible light, especially its intensity and it can be used to describe the image intensity in terms of its perceived brightness to human vision. Photometry can be used to account for the different sensitivities of human vision to light wavelengths by weighting the measured intensity of a wavelength with a factor that is a function of how sensitive the eye is at that wavelength.

Photometric measurements are typically made and reported using electromagnetic radiation sensitive devices that are designed for the specific photometric measurement function. The electromagnetic sensitive device may be, for example, a charge coupled device (CCD) or a complementary metal oxide semiconductor (CMOS) device. FIG. 3 illustrates a pixel array 10 which includes pixel structures such as pixel structure 12 and photometric measurement structures such as photometric measurement structure 14. Typical pixel structures using such photometric measurements devices take photometric measurements in one or more sub-areas of the image to be captured. The measurements of the various sub-images are then processed to determine a level which the image sensitive material should be exposed to electromagnetic radiation. The image undergoes a second processing stage where the image is then captured by exposing the solid-state image sensor device, to the incoming electromagnetic radiation for the pre-calculated exposure time.

However, because the photometric measurements are taken from a generally small subset of points within the image to be captured it is often sub-optimal; any visual attributes and/or artifacts of the sampling points are used to calculate an exposure level that is applied across the image. As a result, exposure times derived from such measurements are often inaccurate and the resulting processed image generally suffers. Another disadvantage of the described method is that it does not consider properties of the image sensor. For example, image sensors may react differently to different intensities of electromagnetic radiation. Blindly applying a weighting factor to the image sensors that does not take into account the gain characteristics of the image sensors may exacerbate the problem of providing an optimal output image.

SUMMARY OF THE INVENTION

A solid-state pixel structure of the present invention includes an image sensor, means for measuring a response of the image sensor to a received electromagnetic radiation and means for reporting a state of the response of the image sensor to an exposure controller.

According to another aspect of the invention, a pixel array includes an exposure controller and at least one group of pixel structures coupled to the exposure controller. Each group of pixel structures includes at least one pixel structure. The pixel structure includes an image sensor, means for measuring a response of the image sensor to received electromagnetic radiation; and means for reporting a state of the response to the exposure controller. The exposure controller analyzes the state of the response(s) to determine whether the state of the response(s) indicates that an exposure termination triggering event has occurred.

According to another aspect of the invention, a method of controlling exposure of a group of pixel structures to electromagnetic radiation is provided. The group of pixel structures comprising at least one pixel structure and each pixel structure having an image sensor. The method includes the steps of at least one pixel structure in the group of pixels measuring a response of an associated image sensor to received electromagnetic radiation and analyzing a state received from at least one pixel structure in the group, the state associated with a measured response to the image sensor of at least one pixel structure, the step of analyzing to determine whether the state of the response indicates that an exposure termination triggering event has occurred, and terminating exposure of the group of pixels structures to the electromagnetic radiation in response to the exposure termination event.

With such an arrangement, pixel structure exposure can be controlled in real-time to allow for optimal image capture. These and other advantages of the invention will become evident upon reading the description below, in conjunction with the attached figures, which describe:

DETAILED DESCRIPTION

According to one aspect of the invention, a solid-state pixel structure or pixel array includes integrated exposure control provided within the pixel structure and/or pixel array. Including exposure control within the pixel structure and/or array allows optimal exposure to be achieved in real time. Optimal exposure is achieved by measuring the response of pixel structures to received electromagnetic radiation, and using the response information, in conjunction with knowledge regarding the pixel structure capabilities and photometric thresholds, to determine when the pixel structure is operating optimally.

In one embodiment, each solid state pixel structure is capable of photometric measurement. The measurements characterize the response of the pixel structure to the electromagnetic radiation. By including photometric measurement capability within the solid-state pixel structure, pixel exposure may be monitored and tightly controlled during image capture. The solid state pixel structure includes reporting logic for reporting exposure response characteristics to an exposure controller. The exposure controller terminates exposure when the exposure response characteristics indicate that an image with optimal exposure has been captured. The measurement and reporting logic of the solid state pixel structure provide dynamic feedback to the exposure controller logic to ensure that the pixel structure is optimally exposed to the electromagnetic radiation, taking into account the real time response of the pixel structure. Exposure complexity and power consumption is reduced because exposure measurements can be handled during image capture, rather than as a separate process.

Figure 4:
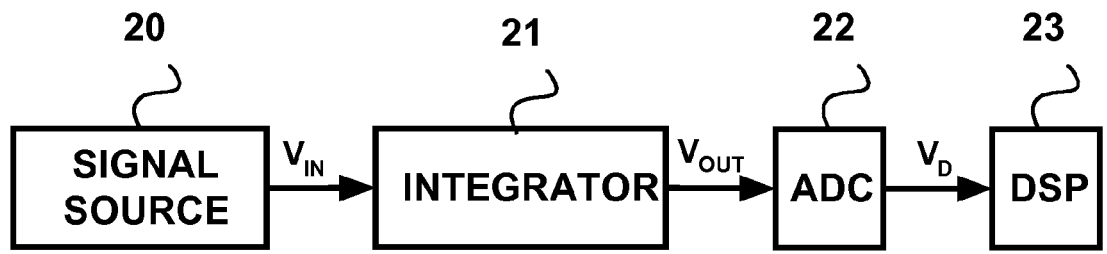
FIG. 4 is a exemplary functionally equivalent block diagram of a typical pixel structure followed by an ADC and a DSP.
Figure 5:
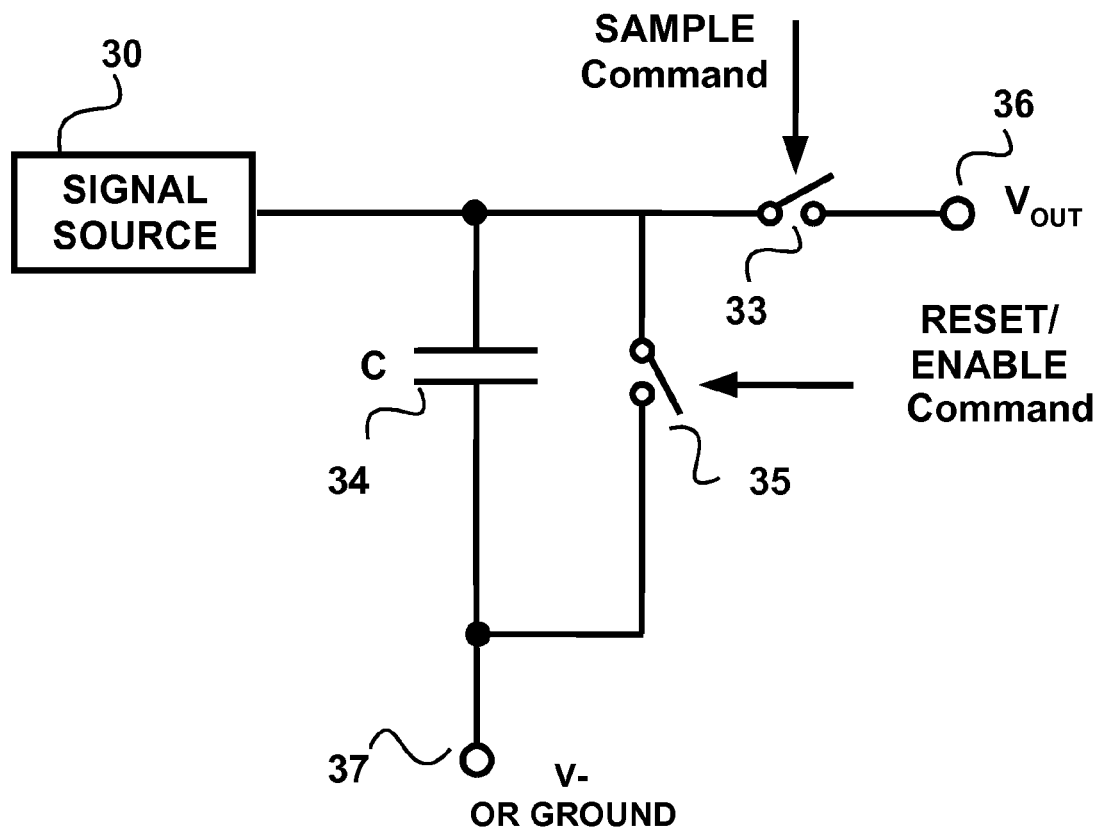
FIG. 5 is a exemplary functionally equivalent circuit diagram of a typical pixel structure.

The advantages of the present invention can best be described by comparison with typical solid state pixel structure operation as described in FIGS. 4 and 5. For example, FIG. 4 is a block diagram illustrating several components that are included in a typical digital image capture device. A signal source 20 is coupled to a signal processing chain that includes an integrator 21, analog to digital converter (ADC) 22 and digital signal processor (DSP) 23. Signal source 20 is a light intensity sensor that generates an electrical response in response to electromagnetic radiation, such as light impinging upon it then sensor 20 and integrator 21 from the core of a typical CMOS pixel structure. Sensor 20 may be used in timed applications, such as in digital camera applications where the sensor is exposed to light for a specific duration of time, commonly referred to as the exposure time. The integrator 21 serves to integrate the response of sensor 20 caused by all photons received during the exposure time into one value, such as for example a voltage, to be read-out at the end of the exposure time.

FIG. 5 illustrates in more detail a typical image sensor assembly circuit. Signal source 30 is a light sensor that by way of example can be said to be a photodiode. Capacitor 34 is a simple integrator. The input to the integrator is the output of signal source 30. Capacitor 34 is reset by switch 35 which is in the closed position prior to starting the integration process. At the start of the integration process switch 35 opens and the voltage across capacitor 34 begins to change in response to the input signal originating from signal source 30. At the end of the integration process switch 33 closes and integrator output 36, $V_{OUT}$, is sampled.

Integrator output 36, $V_{OUT}$, cannot in general exceed the upper limit imposed by the available power supply voltage. Power supply voltages are decreasing in state-of-the-art equipment due to stringent power consumption requirements. Integrator output 36 cannot exceed the power supply voltage and will saturate if the integrator output signal continues to build after reaching the power supply voltage level. Saturation occurs when the output voltage reaches the available power supply voltage and is unable to respond to further changes in the input signal.

The pixel dynamic range, as limited by the integrator, requires careful consideration when setting the exposure time. An exposure time that is too small will prohibit the output of one or more pixels from rising sufficiently high and above the noise floor. An exposure time that is too large will cause the output of one or more pixels to saturate.

Figure 1A:
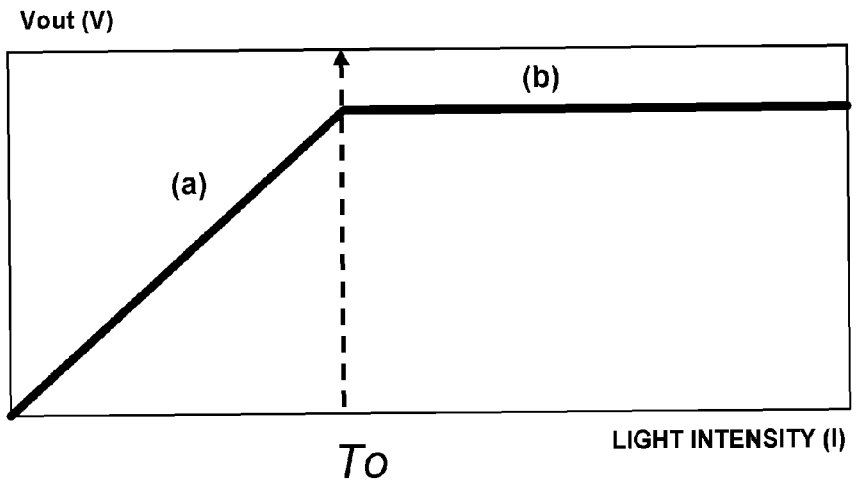
FIGS. 1A-1C illustrate transfer curves of pixel structure response in respective overexposed, underexposed and correctly exposed conditions.
Figure 1B:
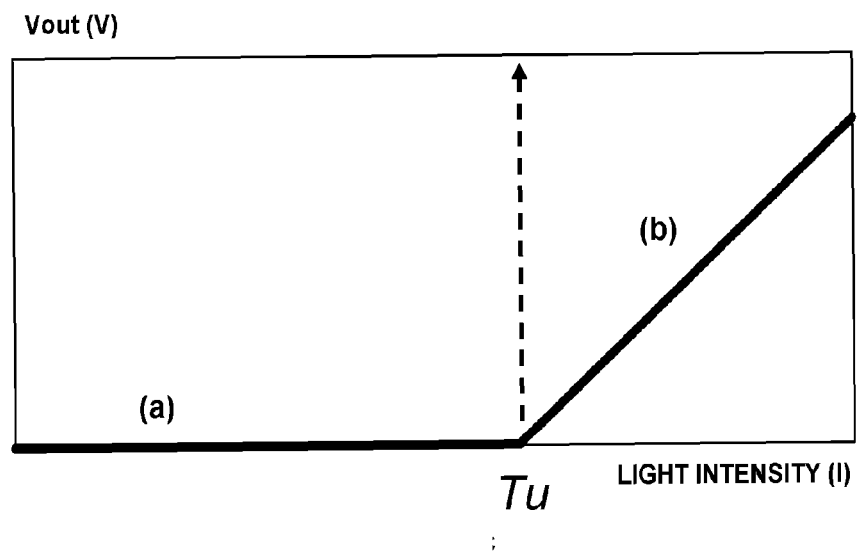
Figure 1C:
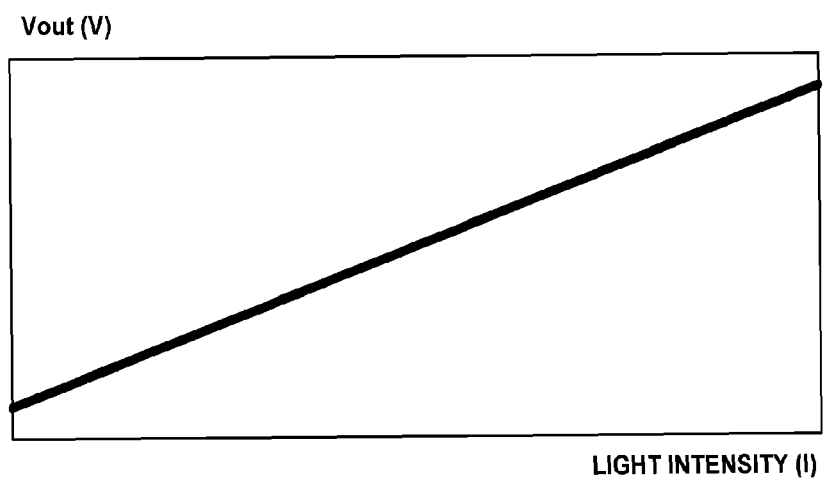
Figure 2A:
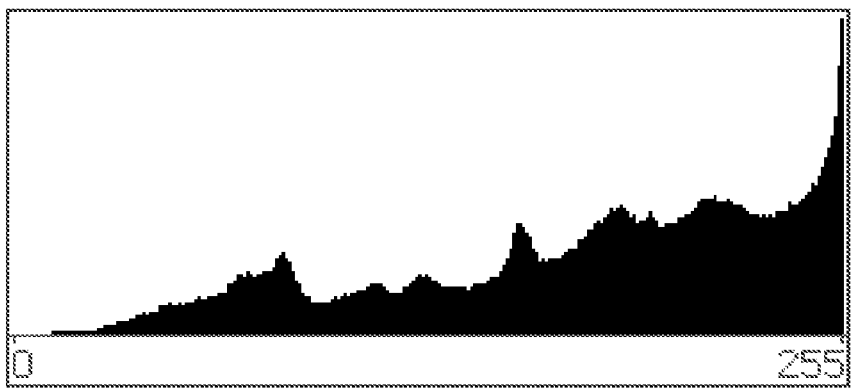
FIGS. 2A-2C are histograms provided to illustrate the distribution of pixel intensities of respective overexposed, underexposed and correctly exposed captured images.
Figure 2B:
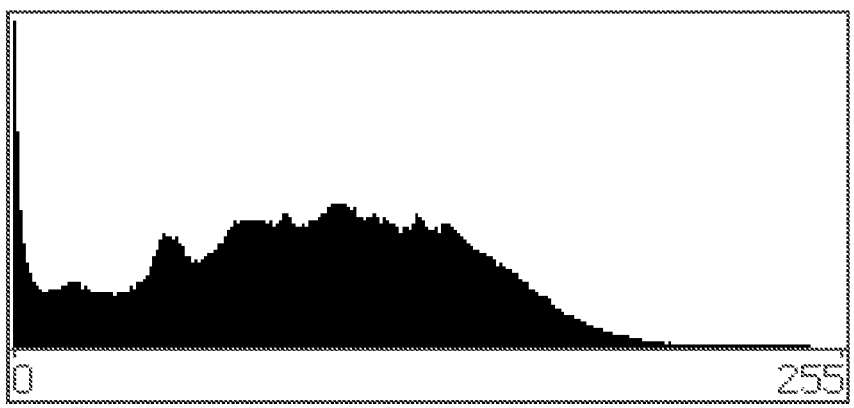
Figure 2C:
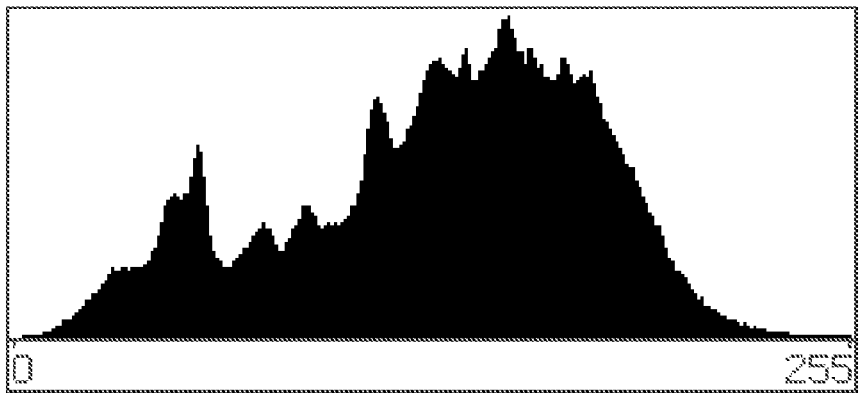
Figure 3:
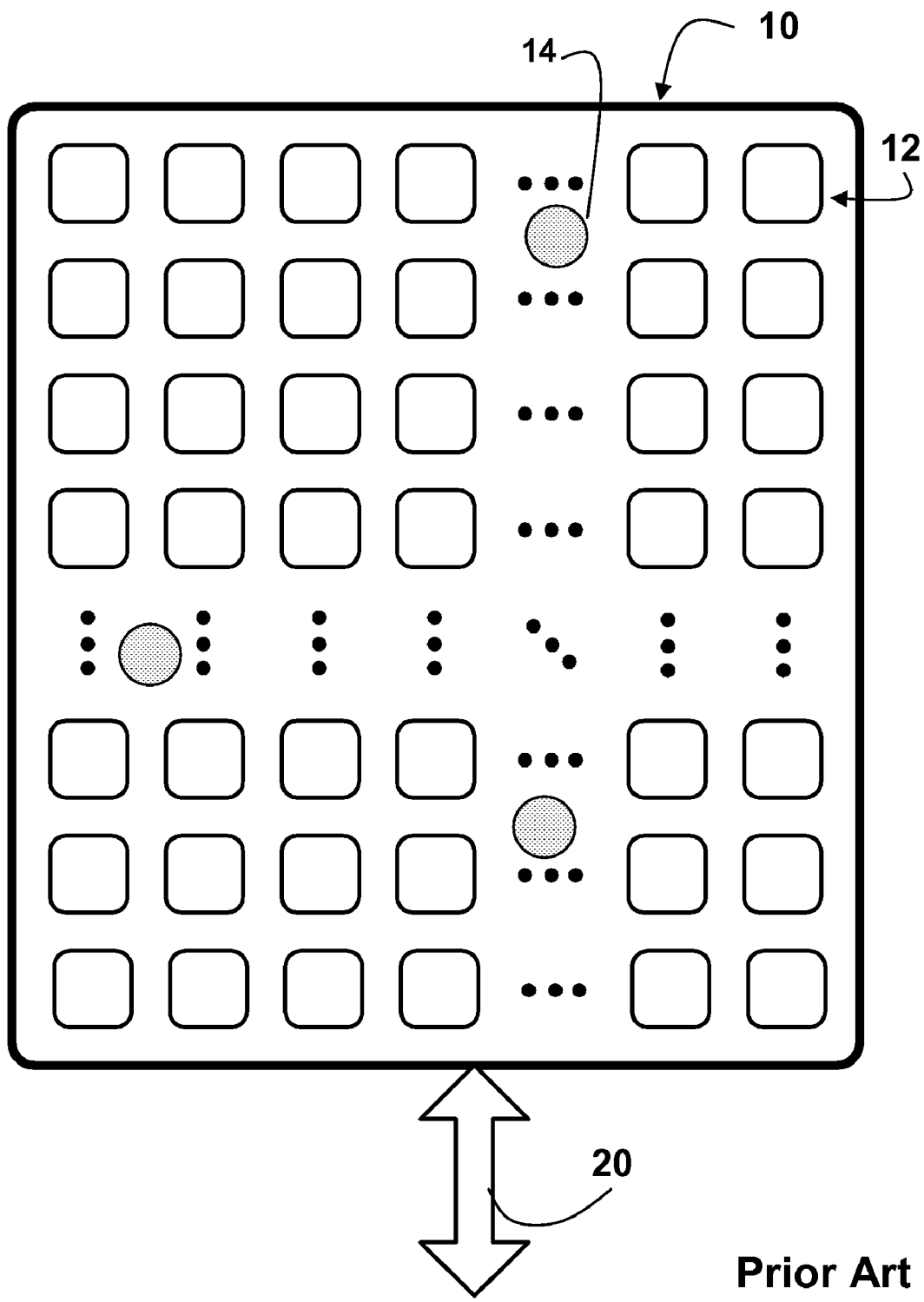
FIG. 3 illustrates an exemplary pixel array structure of the prior art.

As mentioned with regard to FIGS. 1C and 2C, optimal array operation is obtained when all array pixels operate in their linear output range (do not saturate) and generate an output voltage that is above the electronic noise floor. In order to generate an output voltage that is above the electronic noise floor the gain of the pixel structure should be sufficiently high to generate a sufficient output voltage when illuminated by the minimum value of the operational range specified for the electromagnetic radiation intensity. This determines the sensitivity of the pixel structure. The dynamic range of the pixel structure should be sufficiently high in order to always operate in the linear region and not saturate its output when illuminated by electromagnetic radiation intensity having the maximum value of the operational range for the structure.

The present invention recognizes the value of integrating exposure control within the pixel structure, pixel array, or combination thereof. As will be seen below, the integration of exposure control into the pixel structure and/or pixel array allows for optimal image capture with minimal complexity and power consumption. The present invention may be embodied in many different forms, at many different granularities. The embodiments are representative of a subset of equivalent embodiments of the present invention, and the invention is not limited to the disclosed embodiments.

Figure 6:
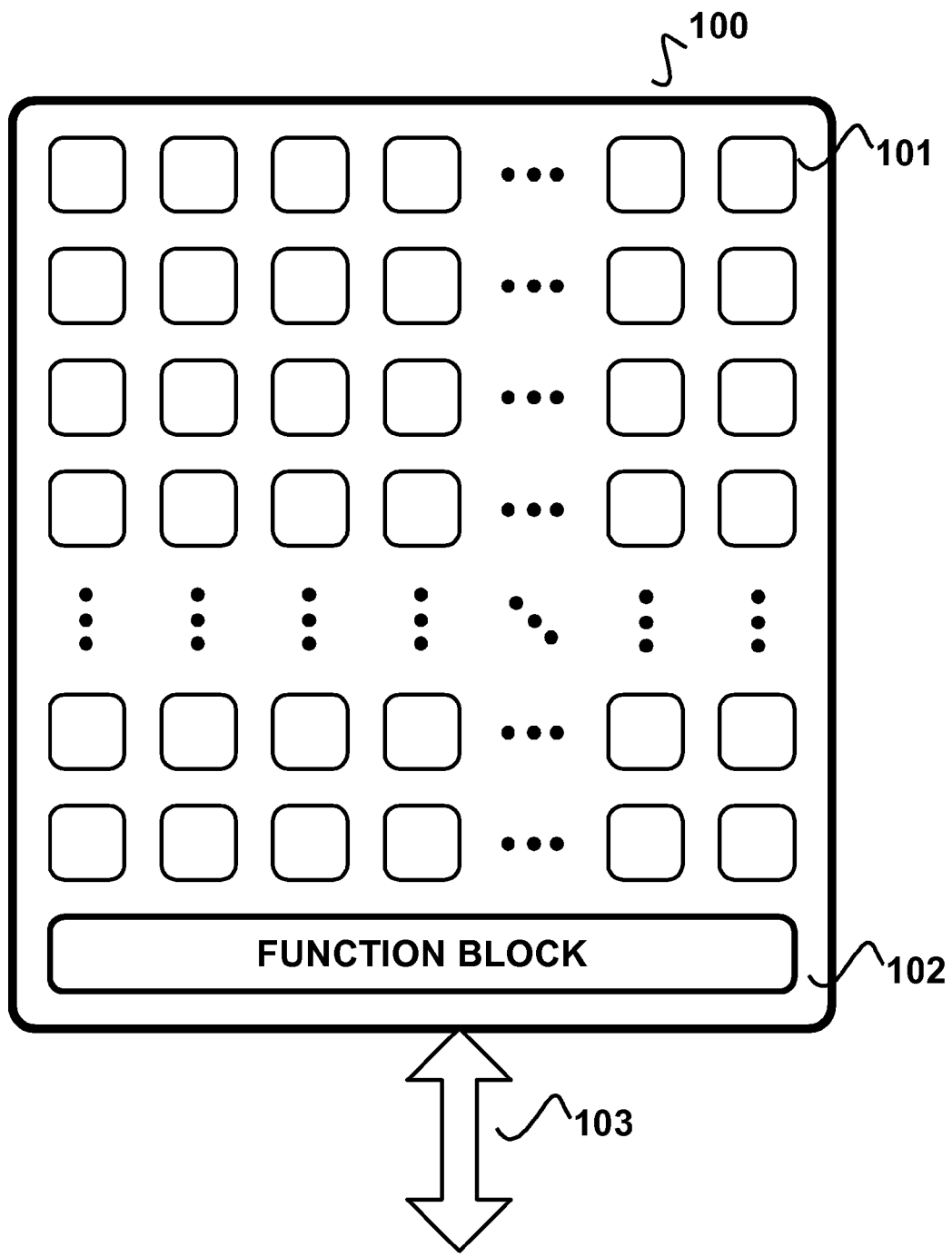
FIG. 6 is a diagram of a solid state pixel array of the present invention, with integrated exposure control.

FIG. 6 illustrates one embodiment of the present invention, in which each pixel such as for example pixel 101 incorporates additional logic capable of reporting when the pixel output has reached specific reportable states. The reportable states that are indicated by the logic are a matter of design choice, and may include, but are not limited to, such states as: the pixel output level has reached the minimum required level, the pixel output level has reached saturation level, the pixel output level has reached a first specific state higher than the minimum required level and lower than saturation, the pixel output level has reached a second specific state that is higher than the minimum required level, lower than saturation and different than the first specific state, the pixel output level has reached a first combination of the above states, and/or the pixel output level has reached a second combination of the above states.

The state information is forwarded to Function Block 102. Function block 102, in one embodiment, communicates with system components external to the pixel array 100 via interface bus 103. The function block 102 is advantageously dynamically programmable, although this is not a requirement. In one embodiment, the function block may be programmed to detect exposure termination trigger conditions. The exposure termination trigger conditions can be selected a priori to the image capture process, or alternatively can be adaptively selected in response to incoming information from the image capture process. By way of example potential preset exposure termination conditions include but are not limited to: an indication that the maximum exposure time that has been set a priori has been reached, an indication that all pixels reported that minimum output voltage has been reached and one pixel reported that its output voltage saturation value has been reached, an indication that a preset number of pixels reported that output saturation voltage has been reached, an indication that a preset number of pixels reported that minimum output voltage has been reached, an indication that a number of pixels larger than a first preset threshold reported that output saturation voltage has been reached and a number of pixels larger than a second preset threshold reported that minimum output voltage has been reached, and an indication that a combination of exposure termination conditions has occurred.

Figure 7:
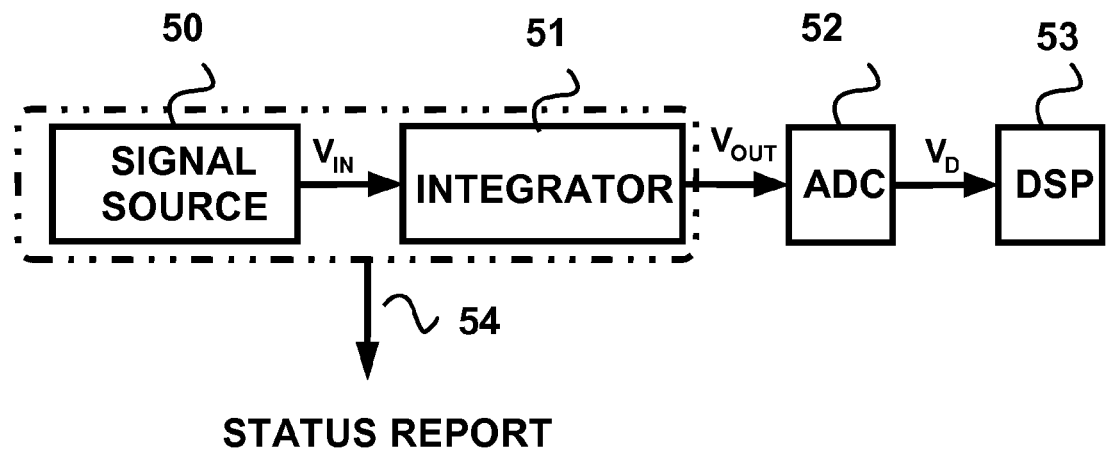
FIG. 7 is a exemplary block diagram illustrating exemplary components and communication buses that may be included in a solid state pixel structure of the present invention.

FIG. 7 is a block diagram illustrating components that may be included in a solid-state pixel structure of the invention. As illustrated in FIG. 7, the pixel structure includes a means, responsive to signal source 50 and integrator 51 that contains the means necessary to generate a status report for forwarding to function block 102. The status report may take any variety of forms depending upon the information that is desired to be communicated between the pixel structure and the function block. For example, in a simplest embodiment, the status report may comprise a trigger signal which when asserted indicates that the pixel has reached a specific state that might in turn indicate the existence of the exposure termination triggering condition. In more complex embodiments, the signal may be encoded, on a serial or multi-bit bus based on a pre-determined communication protocol. Other techniques of communicating data between points in an array may be substituted herein without affecting the scope of the present invention.

Figure 8:
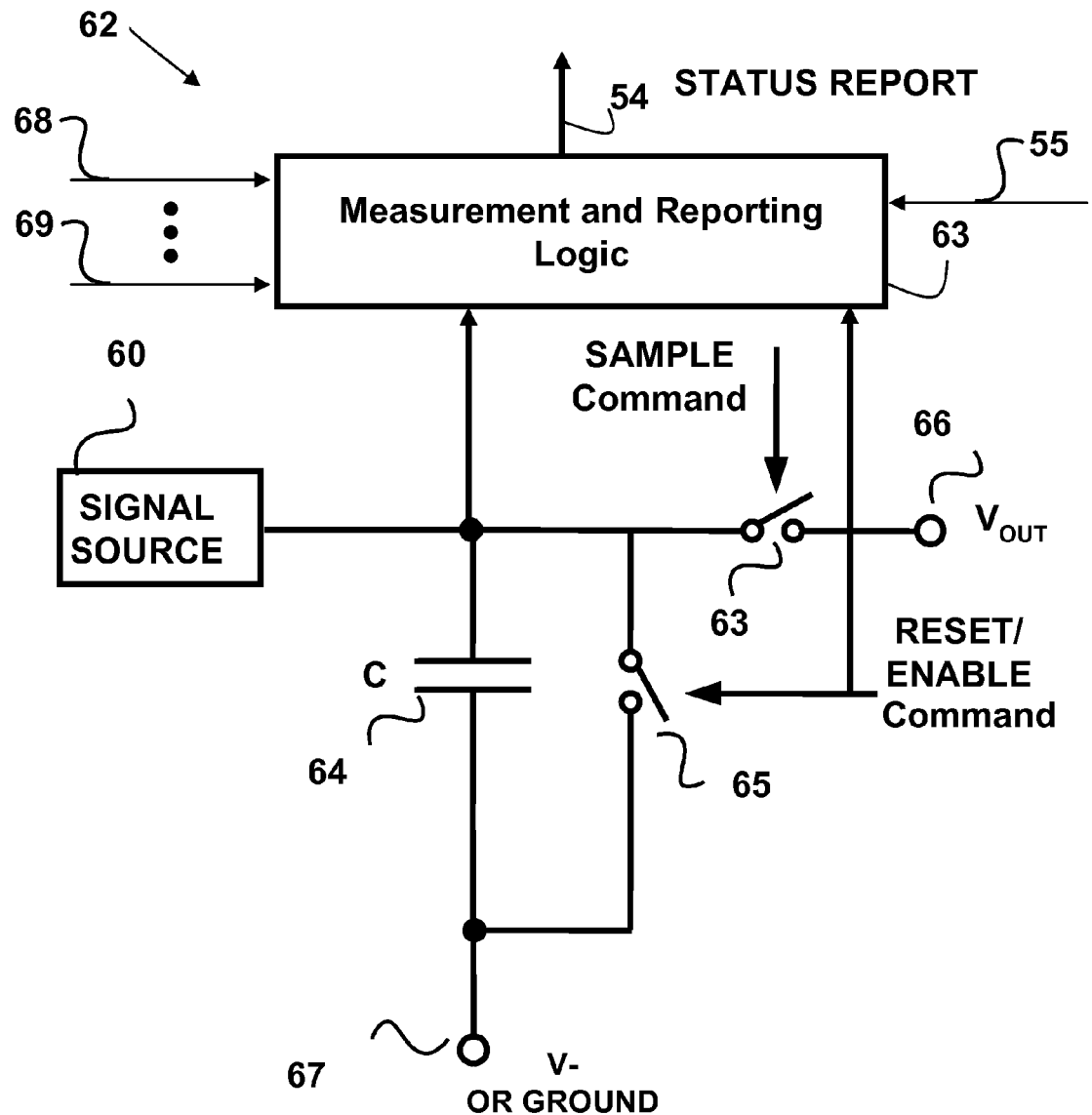
FIG. 8 is an exemplary circuit and block circuit diagram of one embodiment of the solid state pixel structure of FIG. 7.

FIG. 8 provides a more detailed diagram of one embodiment of a solid state pixel structure 62 of the present invention. The structure 62 is similar to that described with regard to FIG. 5, but includes photometric measurement and reporting logic 63 of the present invention. The photometric measurement and reporting logic in one embodiment is dynamically programmable, with the function block including the capability to customize the end of exposure criteria and exposure triggering thresholds of the logic 63 via external input 55. The measurement and reporting logic 63 can be dedicated to one pixel or can serve more than one pixel. When the measurement and reporting logic 63 serves more than one pixel the additional data indicative of the state of the additional pixels is input to the measurement and reporting logic 63 via additional connections. Connectors 68 and 69 are exemplary connectors that bring additional pixel state data to the measurement and reporting logic 63. When the measurement and reporting logic 63 serves more than one pixel the number of additional connections varies according to the implementation specifics. The photometric measurement and reporting logic 63 can operate according to preset or adaptive algorithms. When cost and simplicity of operation is are major considerations the operation of the measurement and reporting logic 63 can be preset and not subject to change. When superior image sensor performance is a major consideration the operation of the measurement and reporting logic 63 can be adaptive and subject to change in response to external commands. Input 55 serves to change the operation of the measurement and reporting logic 63 in response to external commands. The mode of operation of the measurement and reporting logic 63 can be changed via selection among a number of previously programmed modes of operation or via programming a new mode of operation. In an exemplary embodiment, the measurement and reporting logic 63 monitors one or both of the pixel output signal voltage and the Reset/Enable command. Based on either or the combination of the two, and on the programmed trigger conditions for the structure, the measurement and reporting logic 63 provides status signals to the function block 102 to indicate the presence of certain characteristics at the solid-state structure, wherein the characteristics may be the voltage level, voltage level to saturation level ratio, etc. The programmed trigger conditions may take into consideration photometric data when determining trigger thresholds.

FIG. 8 thus illustrates how measurement and reporting capabilities may be incorporated in a CMOS image sensor such as that of FIG. 5. However, the present invention is not limited to use with only CMOS image sensors, or for that matter to digital image sensors. Rather, the concept of measuring responses to electromagnetic radiation, and using the measurements in conjunction with knowledge including knowledge regarding sensor behavior to control exposure can be used in conjunction with any image sensitive device. In one embodiment of the invention, a pixel structure includes a sensor device comprising a high resolution and wide dynamic range such as that described in patent application Ser. No. 11/533,866, entitled "SYSTEM AND METHOD FOR A HIGH DYNAMIC RANGE SENSITIVE SENSOR ELEMENT OR ARRAY" by Davidovici, incorporated herein by reference. In an alternate embodiment, a pixel structure includes a sensor device such as that disclosed in patent Ser. No. 11/533,870 entitled "SYSTEM AND METHOD FOR A HIGH DYNAMIC RANGE SENSITIVE SENSOR ELEMENT OR ARRAY WITH GAIN CONTROL" filed on even date herewith by Davidovici, incorporated herein by reference.

Figure 9:
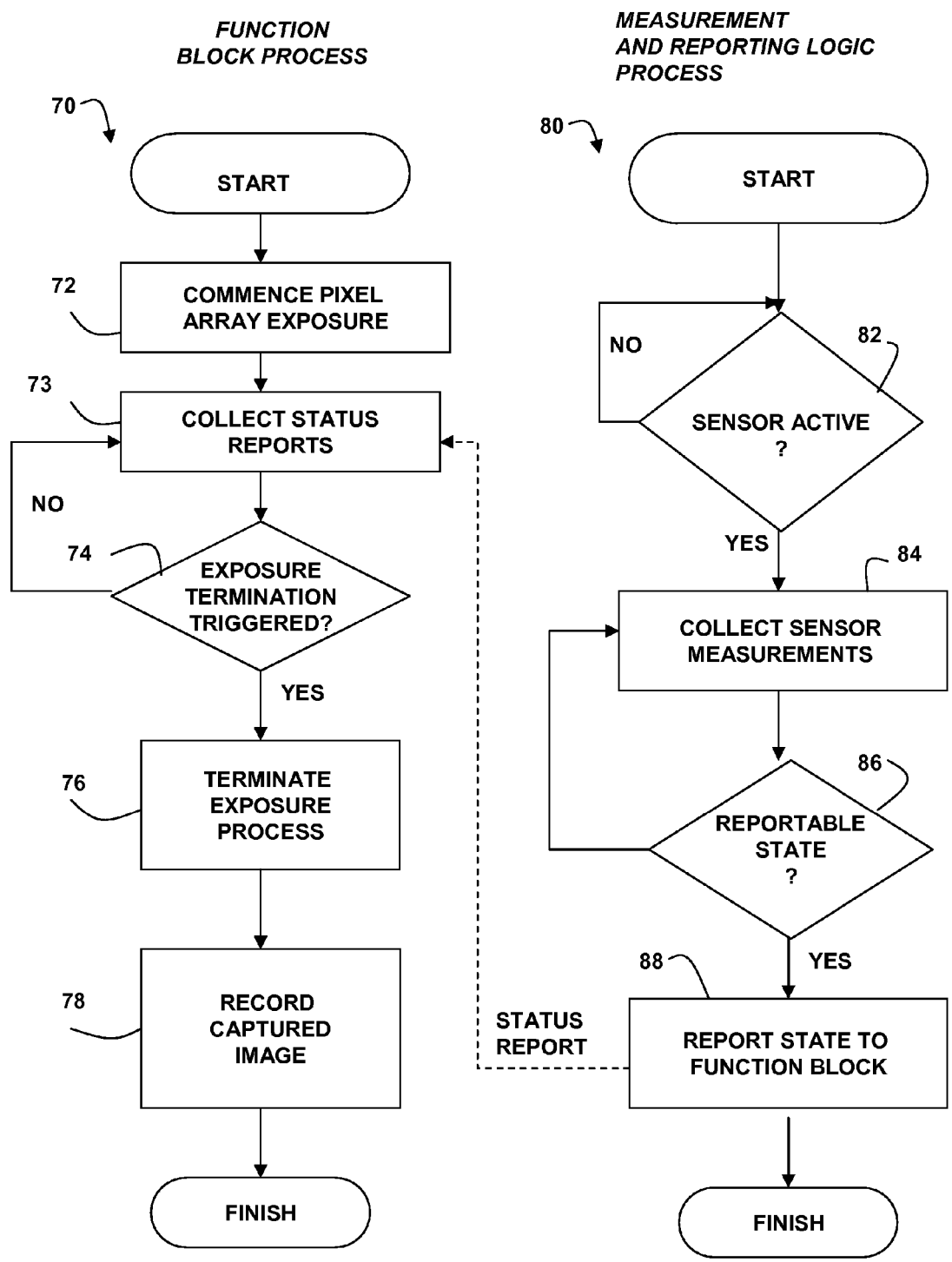
FIG. 9 is a functional flow diagram provided to illustrate exemplary steps that may be taken in the exposure control process of the present invention.

FIG. 9 includes a pair of functional flow diagrams that are provided to illustrate steps that may be performed by the function block 102 and measurement and reporting logic of pixel 101, as well as exemplary communications that may occur between the components. Process 70 includes steps that may be performed by the function block 102, while process 80 illustrates steps that may be performed by the measurement and reporting logic 80. It should be noted that FIG. 9 is meant as an illustrative, not limiting, example which in its equivalents may take many different forms, and have portions of which are controlled by hardware, software, or a combination thereof.

The function block process initiates at step 72 when pixel structure exposure is initiated, for example when the camera trigger is depressed. The function block proceeds to step 73, where it gathers status reports from groups of pixels, each group including one or more pixels.

The measurement and reporting block initiates processing when the image sensor becomes active at step 82. For example, it may detect a voltage from the image sensor. At step 84, sensor measurements are monitored or collected to determine when the pixel structure is at a reportable state. When it is determined that the pixel structure is at a reportable state, the state is reported, and step 88 to the function block.

The function block 102, 240, 340, 440 analyzes the status reports, received from one or more pixel structures to determine when an exposure termination trigger event has occurred. When the triggering event has occurred, the function block terminates the exposure at step 76. The function block may terminate exposure for one or more pixels in the pixel array based on the triggering conditions, and thus the present invention is not limited to any exposure termination granularity. At step 78, the captured image is recorded in a storage medium.

The above described approach to exposure time determination has the major benefit that the exposure time setting is performed while the image is captured (or acquired) thus attaining maximum accuracy. The flexibility to determine the exposure termination condition as the image capture process is on-going has the benefit of allowing the exposure time to be adaptive and matched to the characteristics of the image to be captured.

The embodiment described with regard to FIG. 6, which includes photometric measuring and reporting in each pixel structure is relatively complex due to the large number of pixels contained within commercially available pixel arrays. Meaningful images that are commonly the object of image capture such as might be the case in digital still photography or video cameras exhibit a high correlation between adjacent pixels. The high adjacent pixel correlation renders much of the reported pixel output data redundant.

Figure 10:
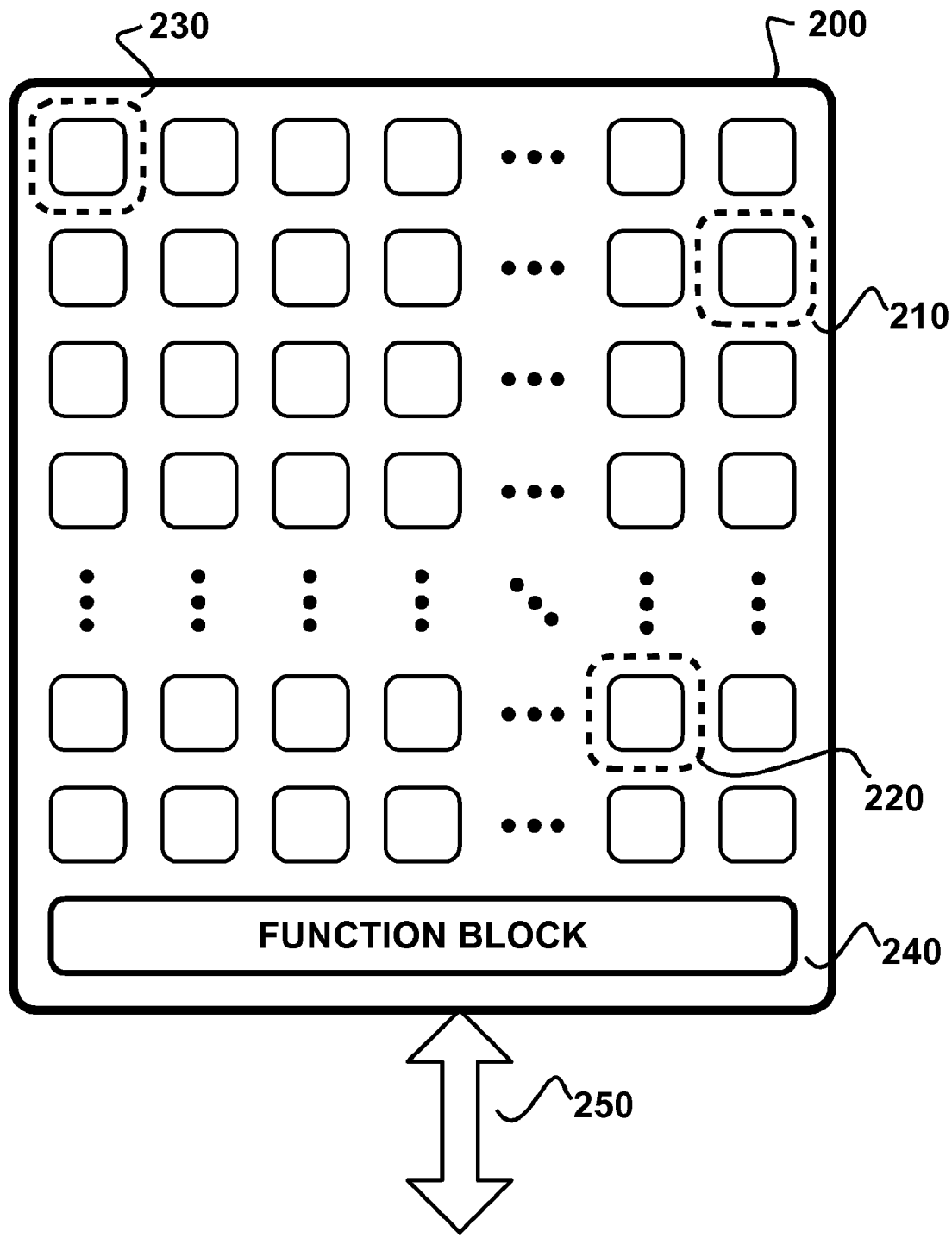
FIG. 10 illustrates a second embodiment of a solid state pixel array incorporating integrated exposure control of the present invention.

FIG. 10 illustrates another embodiment of the present invention, wherein a pixel array 200 is arranged with fewer than all pixels reporting the state of their output. The reporting pixels exemplified by pixels 230, 210 and 220 can be arranged in a regular or in a random pattern throughout the pixel array. High correlation between adjacent pixels is used to limit the number of reporting pixels with minimal degradation of the image capture process. Thus, the lower limit of the number of reporting pixels can be one and the upper limit of the number of reporting pixels can equal the size of the array.

Figure 11:
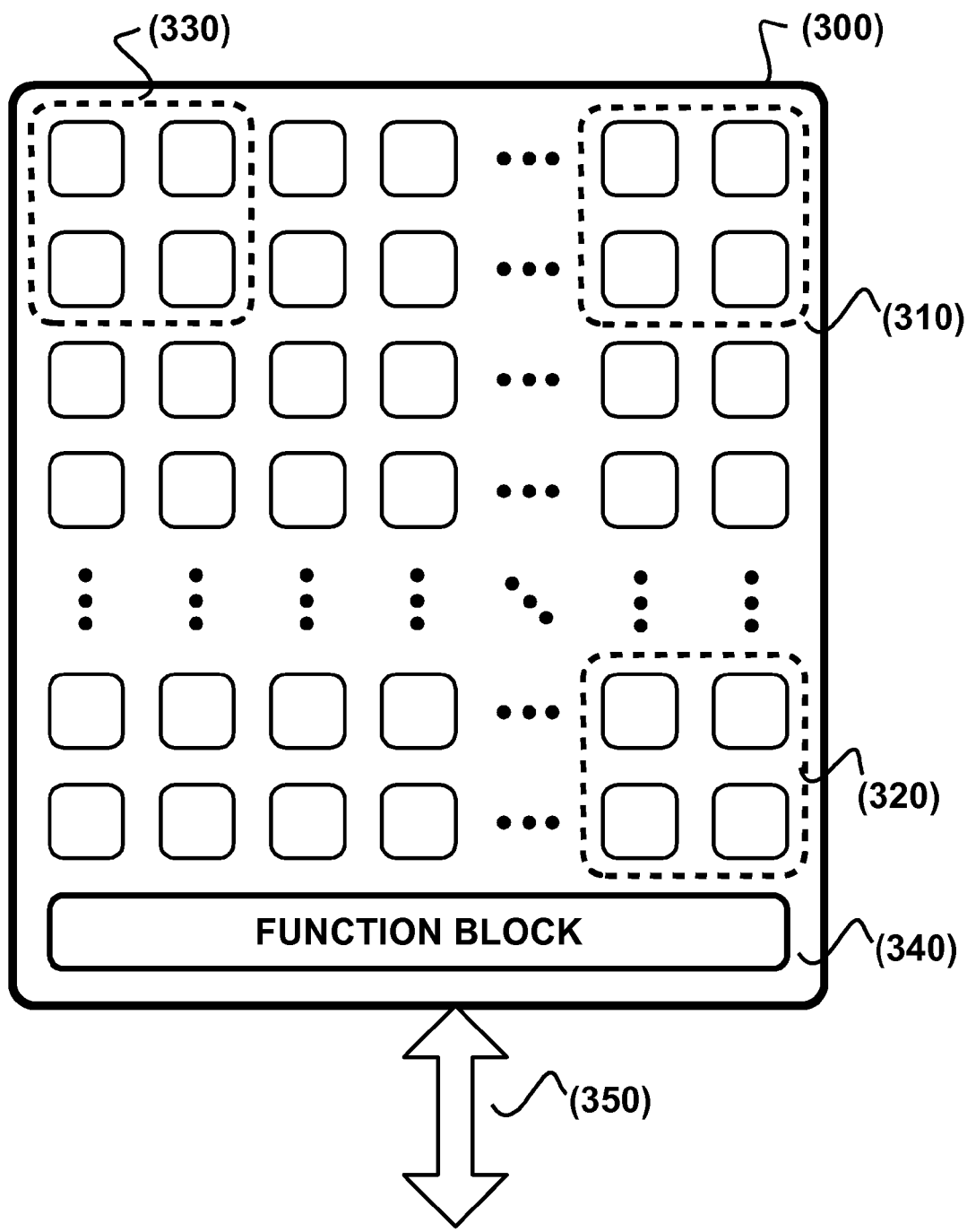
FIG. 11 illustrates a third embodiment of a solid state pixel array incorporating integrated exposure control of the present invention.

FIG. 11 illustrates yet another embodiment of the invention, having reduced the complexity as compared to the embodiments of FIGS. 6 and 10. In FIG. 11, a pixel array 300 is apportioned into pixel groups so that the pixels that are capable of reporting the state of their output are grouped together. A group of pixels capable of output state reporting can contain as few as two pixels and as many as the number of pixels contained in the array, however all groups contain an identical number of pixels. The reporting pixel groups exemplified by pixel groups 330, 310 and 320 that contain four pixels can be arranged in a regular or in a random pattern throughout the pixel array. The lower limit of the number of reporting pixels can be one and the upper limit of the number of reporting pixels can equal the size of the array divided by two.

Figure 12:
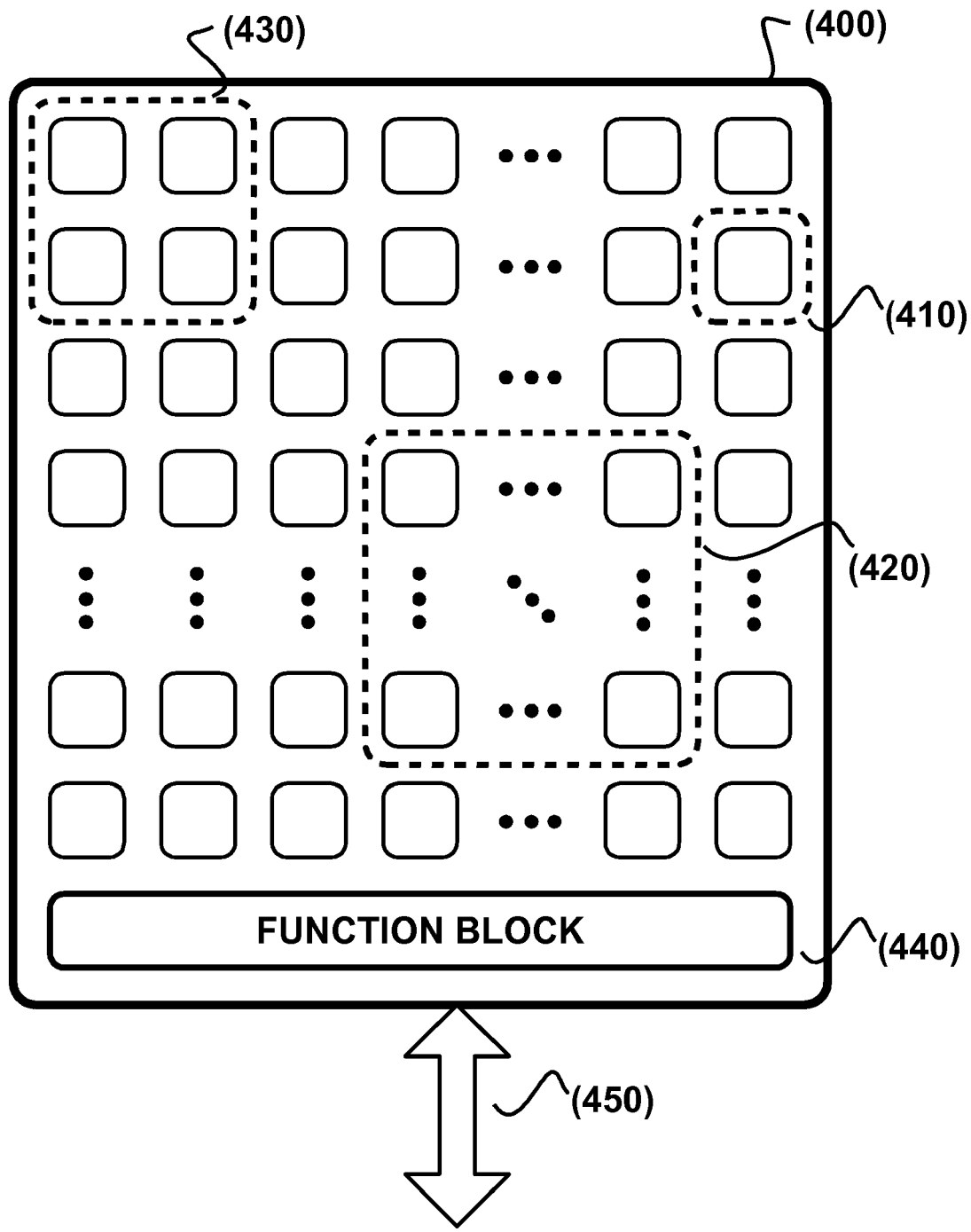
FIG. 12 illustrates a fourth embodiment of a solid state pixel array incorporating integrated exposure control of the present invention.

FIG. 12 illustrates yet another embodiment of the invention, wherein the pixels that are capable of reporting the state of their output are grouped together. A group of pixels capable of output state reporting can contain as few as one pixel and as many as the number of pixels contained in the array. The embodiment of FIG. 12 differs from that of FIG. 11, as groups may vary in size. The reporting pixel groups exemplified by pixel groups 430, 410 and 420 contain one, four and a number larger than four pixels, respectively, and can be arranged in a regular or in a random pattern throughout the pixel array. The lower limit of the number of reporting pixel groups can be one and the upper limit of the number of reporting pixel groups can equal the size of the array.

Accordingly, a method and apparatus for controlling pixel array exposure time using pixel structures and arrays having integrated exposure control has been shown and described in various embodiments. Accordingly, the present invention overcomes the problems of the prior art by providing an improved image sensor which includes photometric measuring and reporting capability. The measuring and reporting capability can be used to control the exposure of the image sensor to the electromagnetic radiation, thereby enabling exposure to be terminated when the image sensor has reached an optimum exposure point or some other triggering threshold level. In addition, it allows exposure to be controlled in real-time, rather than as a secondary process performed on the image after capture.

There are numerous benefits of the present invention. The first benefit is the inherent accuracy of the approach described herein where the data used to determine the pixel array exposure is extracted from the image being captured in real time simultaneously with the capture process. A second benefit is that incorporating the photometric measurement capability into the pixel structure itself ensures that any gain characteristics of the solid-state image sensor are considered when determining appropriate exposure levels. Reduced power consumption due to the elimination of the double capture process required to determine the exposure time in one commonly used approach is a third benefit. These and other benefits of the present invention are obvious to one conversant with the art.

Having described various embodiments of the invention, it will be appreciated that many of the above figures are flowchart illustrations of methods, apparatus (systems) and computer program products according to an embodiment of the invention. It will be understood that each block of the flowchart illustrations, and combinations of blocks in the flowchart illustrations, can be implemented by computer program instructions. These computer program instructions may be loaded onto a computer or other programmable data processing apparatus to produce a machine, such that the instructions which execute on the computer or other programmable data processing apparatus create means for implementing the functions specified in the flowchart block or blocks. These computer program instructions may also be stored in a computer-readable memory that can direct a computer or other programmable data processing apparatus to function in a particular manner, such that the instructions stored in the computer-readable memory produce an article of manufacture including instruction means which implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the flowchart block or blocks.

Those skilled in the art should readily appreciate that programs defining the functions of the present invention can be delivered to a computer in many forms; including, but not limited to: (a) information permanently stored on non-writable storage media (e.g. read only memory devices within a computer such as ROM or CD-ROM disks readable by a computer I/O attachment); (b) information alterably stored on writable storage media (e.g. floppy disks and hard drives); or (c) information conveyed to a computer through communication media for example using baseband signaling or broadband signaling techniques, including carrier wave signaling techniques, such as over computer or telephone networks via a modem The above description and figures have included various process steps and components that are illustrative of operations that are performed by the present invention. However, although certain components and steps have been described, it is understood that the descriptions are representative only, other functional delineations or additional steps and components can be added by one of skill in the art, and thus the present invention should not be limited to the specific embodiments disclosed. In addition it is understood that the various representational elements may be implemented in hardware, software running on a computer, or a combination thereof.

While the invention is described through the above exemplary embodiments, it will be understood by those of ordinary skill in the art that modification to and variation of the illustrated embodiments may be made without departing from the inventive concepts herein disclosed. Accordingly, the invention should not be viewed as limited except by the scope and spirit of the appended claims.

The invention claimed is:

1. A reporting pixel structure comprising:
an image sensor;
means for measuring a response of the image sensor to a received electromagnetic radiation;
means for providing a report of a state of the image sensor output relative to a trigger level to an exposure controller; and
means, responsive to an input signal from the exposure controller, for terminating exposure of the image sensor to the received electromagnetic radiation, wherein the received input signal is generated by the exposure controller in response to a plurality of reports received from a plurality of reporting pixel structures.

2. A pixel array comprising:
a plurality of pixel structures including at least two reporting groups of pixel structures, each of the reporting groups of pixel structures including at least one reporting pixel structure comprising:
an image sensor,
means for measuring an output of the image sensor generated in response to received electromagnetic radiation including means for generating a report identifying a state of the output relative to at least one trigger level; and
an exposure controller, coupled to receive a plurality of reports from a plurality of reporting groups of pixel structures and to control the exposure of all pixels in the pixel array in response to the states of the outputs of the reporting pixel structures in the plurality of received reports.

3. The pixel array of claim 2 wherein the exposure controller is integrated in the pixel array and processes the received reports to determine whether a triggering event has occurred.

4. The pixel array of claim 2 wherein the exposure controller is coupled to the pixel array and processes the received reports to determine whether a triggering event has occurred.

5. The pixel array of claim 2, wherein each reporting group of pixels provides one report to the exposure controller.

6. The pixel array of claim 5, wherein the reporting group comprises a plurality of pixel structures, and wherein the report of the reporting group reports the state of the response of only one of the pixels of the reporting group.

7. The pixel array of claim 5, wherein the reporting group comprises a plurality of pixel structures, and wherein the report reports the state of the response of more than one of the pixels of the reporting group.

8. The pixel array of claim 5, wherein at least two reports provided by the associated at least two reporting groups report responses from different numbers of pixels in the associated at least two reporting groups.

9. The pixel array of claim 2 wherein the state is selected from a group including at least one of: the output is higher than a minimum level, the output is reaching a saturation level, the output value is in a first predefined state that is higher than the minimum level and lower than the saturation level, the output value is in a second predefined state that is higher than the minimum level, lower than the saturation level and higher than the first predefined state.

10. The pixel array of claim 2 wherein the exposure controller controls termination of exposure in response to the reports indicating that a trigger event occurred and the trigger event is programmable.

11. The pixel array of claim 2 wherein a content of the report is programmable.

12. The pixel array of claim 2, wherein the exposure controller processes the reports to determine whether a triggering event has occurred and wherein the triggering event includes at least one of an indication that a maximum exposure time set a priori has been reached, an indication that all reporting pixels in the pixel array have reported that a minimum output signal has been reached, an indication that at least one pixel has reported that its output saturation value has been reached, an indication that a preset number of pixels reported that output signal saturation value has been reached, an indication that a preset number of pixels reported that minimum output signal has been reached, an indication that a number of pixels larger than a first preset threshold reported that output signal saturation value has been reached and a number of pixels larger than a second preset threshold reported that minimum output signal has been reached or an indication that a combination of exposure termination conditions has occurred.

13. A pixel array comprising:
a plurality of pixel structures including at least two reporting groups of pixel structures, each of the reporting groups of pixel structures including at least one reporting pixel structure comprising:
an image sensor,
means for measuring an output of the image sensor generated in response to received electromagnetic radiation including means for generating a report identifying a state of the output relative to at least one trigger level; and
an exposure controller, coupled to receive a plurality of reports from a plurality of reporting groups of pixel structures and to control the exposure of all pixels in the pixel array in response to the states of the outputs of the reporting pixel structures in the plurality of received reports, wherein a plurality of reporting group of pixels each provide a set of multiple reports to the exposure controller.

14. The pixel array of claim 13 wherein the exposure controller processes one set of multiple reports to determine exposure for the pixel array.

15. The pixel array of claim 14, wherein the one set of multiple reports includes a report for a state of the response of the output value of the image sensor relative to the triggering level of one of the pixels in the associated group of pixels.

16. The pixel array of claim 14 wherein the one set of multiple reports includes a report of states of the responses of more than one of the pixels in the associated group of pixels.

17. The pixel array of claim 13 wherein the exposure controller processes multiple sets of multiple reports to determine exposure for the pixel array.

18. The pixel array of claim 17, wherein one of the multiple reports includes a report of a response of one of the pixels in an associated group of pixels.

19. The pixel array of claim 17 wherein one of the multiple reports includes a report of a response of more than one of the pixels in the associated group of pixels.

20. The pixel array of claim 17, wherein at least two of the multiple reports provided by an associated at least two groups report responses from different numbers of pixels in the associated at least two groups.

21. A method of controlling exposure of a pixel array comprising a plurality of groups of pixel structures, at least two of the groups each including a reporting pixel structure, the method including the steps of:
measuring, at each reporting pixel structure, an output of an image sensor of the reporting pixel structure generated in response to received electromagnetic radiation and generating a report of a state of the output relative to a triggering level;

processing at least two reports received from the at least two groups of pixel structures that include a reporting pixel structure to determine whether a triggering event has occurred, and terminating exposure of the pixel array in response to the states of the outputs of the reporting pixel structures satisfying a triggering event.

22. The method of claim 21, wherein each group of pixels that includes a reporting pixel generates one report.

23. The method of claim 22, wherein the one report reports a response of one of the pixels in the group of pixels.

24. The method of claim 22 wherein the one report reports a response of more than one of the pixels in the group of pixels.

25. The method of 22 wherein the step of terminating exposure is responsive to more than one report received from groups of pixels that include a reporting pixel structure.

26. The method of claim 25, wherein at least one report reports a response of one of the pixels in the group of pixels associated with the at least one report.

27. The method of claim 25 wherein at least one report reports a response of more than one of the pixels in the group of pixels associated with the at least one report.

28. The method of claim 25, wherein at least two reports provided by an associated at least two groups report responses from different numbers of pixels in the associated at least two groups.

29. The method of claim 28 wherein the step of terminating exposure operates in response to multiple sets of multiple reports to determine exposure for the pixel array.

30. The method of claim 29, wherein one set of the multiple reports includes a report of a response of one of the pixels in an associated group of pixels.

31. The method of claim 29 wherein one set of the multiple reports includes a report of a response of more than one of the pixels in the associated group of pixels.

32. The method of claim 29, wherein at least two sets of the multiple reports provided by an associated at least two groups report responses from different numbers of pixels in the associated at least two groups.

33. The method of claim 21 wherein the state is selected from a group including at least one of: the output is higher than a minimum level, the output is reaching a saturation level, the output value is in a first predefined state that is higher than the minimum level and lower than the saturation level, the output value is in a second predefined state that is higher than the minimum level, lower than the saturation level and higher than the first predefined state.

34. The method of claim 21, wherein at least one of the groups includes a plurality of reporting pixels, and wherein the step of terminating exposure operates in response to one or more sets of multiple reports received from one or more group of pixels.

35. The method of claim 34 wherein the step of terminating exposure operates in response to only one set of multiple reports from one group of pixels.

36. The method of claim 35 wherein the one set of multiple reports includes a report for a response of one of the pixels in the associated group of pixels.

37. The method of claim 35 wherein the one set of multiple reports includes a report of a response of more than one of the pixels in the associated group of pixels.

38. The method of claim 21, wherein the triggering event includes at least one of an indication that a maximum exposure time set a priori has been reached, an indication that all reporting pixels in the pixel array have reported that a minimum output signal has been reached, an indication that at least one pixel has reported that its output saturation value has been reached, an indication that a preset number of pixels reported that output signal saturation value has been reached, an indication that a preset number of pixels reported that minimum output signal has been reached, an indication that a number of pixels larger than a first preset threshold reported that output signal saturation value has been reached and a number of pixels larger than a second preset threshold reported that minimum output signal has been reached, or an indication that a combination of exposure termination conditions has occurred.

* * * * *